(12) United States Patent
Shibuya et al.

(10) Patent No.: US 7,897,209 B2
(45) Date of Patent: Mar. 1, 2011

(54) APPARATUS AND METHOD FOR PRODUCING ALIGNED CARBON-NANOTUBE AGGREGATES

(75) Inventors: Akiyoshi Shibuya, Tokyo (JP); Keiichi Kawata, Tokyo (JP); Kohei Arakawa, Tokyo (JP); Kenji Hata, Tsukuba (JP); Motoo Yumura, Tsukuba (JP)

(73) Assignees: Zeon Corporation, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/679,869

(22) PCT Filed: Apr. 2, 2009

(86) PCT No.: PCT/JP2009/056878
§ 371 (c)(1),
(2), (4) Date: Mar. 24, 2010

(87) PCT Pub. No.: WO2009/128349
PCT Pub. Date: Oct. 22, 2009

(65) Prior Publication Data
US 2010/0196600 A1    Aug. 5, 2010

(30) Foreign Application Priority Data
Apr. 16, 2008  (JP) .............................. 2008-107327
Feb. 10, 2009  (JP) .............................. 2009-029129

(51) Int. Cl.
*C23C 16/00* (2006.01)
(52) U.S. Cl. .................................. 427/249.1; 427/248.1
(58) Field of Classification Search ............... 427/249.1, 427/248.1
See application file for complete search history.

(56) References Cited

U.S. PATENT DOCUMENTS
7,160,531 B1    1/2007  Jacques et al.
(Continued)

FOREIGN PATENT DOCUMENTS
JP    2001-220674 A    8/2001
(Continued)

OTHER PUBLICATIONS
International Search Report, dated Jun. 23, 2009, issued in corresponding PCT/JP2009/056878.
(Continued)

*Primary Examiner*—Timothy H Meeks
*Assistant Examiner*—Kelly M Gambetta
(74) *Attorney, Agent, or Firm*—Birch, Stewart, Kolasch & Birch, LLP

(57) ABSTRACT

An apparatus of the present invention for producing an aligned carbon-nanotube aggregate is an apparatus for producing an aligned carbon-nanotube aggregate by synthesizing the aligned carbon-nanotube aggregate on a base material having a catalyst on a surface thereof, the apparatus including: a formation unit that processes a formation step of causing an environment surrounding the catalyst to be an environment of a reducing gas and heating at least either the catalyst or the reducing gas; a growth unit that processes a growth step of synthesizing the aligned carbon-nanotube aggregate by causing the environment surrounding the catalyst to be an environment of a raw material gas and by heating at least either the catalyst or the raw material gas; and a transfer unit that transfers the base material at least from the formation unit to the growth unit. Thus provided is a production apparatus and a production method that are capable of improving efficiency in the production of aligned CNT aggregates by preventing a decrease in production volume and deterioration in quality of aligned CNT aggregates in serial production and by making it easy to increase the size of the apparatus.

12 Claims, 5 Drawing Sheets

U.S. PATENT DOCUMENTS

| | | |
|---|---|---|
| 2002/0131910 A1 | 9/2002 | Resasco et al. |
| 2004/0149209 A1* | 8/2004 | Dai et al. .................... 118/715 |
| 2005/0074392 A1 | 4/2005 | Yang et al. |
| 2005/0238810 A1 | 10/2005 | Scaringe et al. |

FOREIGN PATENT DOCUMENTS

| | | |
|---|---|---|
| JP | 2001-220674 A | 8/2001 |
| JP | 2003-171108 A | 6/2003 |
| JP | 2003-238125 A | 8/2003 |
| JP | 2003-238125 A | 8/2003 |
| JP | 2006-16232 A | 1/2006 |
| JP | 2007-91556 A | 4/2007 |
| JP | 2007-92152 A | 4/2007 |

OTHER PUBLICATIONS

Morio Yumura et al.; Development in Mass Production Techniques of Single-Walled Carbon Nanotubes; Electrochemistry, pp. 370-373, 2007 (with full English Translation).

Hata et al., "Water-Assisted Highly Efficient Synthesis of Impurity-Free Single-Walled Carbon Nanotubes", *Science*, vol. 306, Nov. 19, 2004, pp. 1362-1364.

European Search Report issued Sep. 23, 2010 in corresponding European Application No. 09731859.6.

* cited by examiner

US 7,897,209 B2

APPARATUS AND METHOD FOR PRODUCING ALIGNED CARBON-NANOTUBE AGGREGATES

TECHNICAL FIELD

The present invention relates to apparatuses for producing aligned carbon-nanotube aggregates and, in particular, to an apparatus and method for producing an aligned carbon-nanotube aggregate, the apparatus and method being capable of remarkably improving production efficiency without entailing deterioration in quality during serial production.

BACKGROUND ART

Carbon nanotubes (hereinafter referred to also as "CNTs") are carbon structures each structured such that a carbon sheet composed of a planar hexagonal arrangement of carbon atoms is sealed in a cylindrical shape. The CNTs are classified into single-walled CNTs and multiwall CNTs, both of which are expected to develop into functional materials such as electronic device materials, optical element materials, and conducting materials because of their mechanical strength, optical properties, electrical properties, thermal properties, and molecular-adsorbing functions, etc.

Among the CNTs, the single-walled CNTs are excellent in various properties such as electrical properties (extremely high in current density), heat properties (comparable in specific thermal conductivity to diamonds), optical properties (emit light in a optical communication band of wavelengths), hydrogen storage capability, and metal catalyst supporting capability. Moreover, the single-walled CNTs exhibit the properties of both semiconductors and metals, and therefore have drawn attention as materials for nanoelectronics devices, nanooptical elements, and energy storage bodies.

In the case of making efficient use of CNTs for these purposes, it is desirable that a plurality of CNTs be aligned along a particular direction to form an aggregate in the form of a bundle, a film, or a mass, and that the CNT aggregate exhibit functionalities such as electric/electronic functionalities and optical functionalities. Further, it is preferable that the CNT aggregate be larger in height (length). It is predicted that creation of such an aligned CNT aggregate will lead to a dramatic expansion in the field of application of CNTs.

A known method for producing such CNTs is a chemical vapor deposition method (hereinafter referred to also as "CVD method") (e.g., see Patent Literature 1). This method is characterized in bringing a carbon-containing gas (hereinafter referred to as "raw material gas") into contact with a catalyst, i.e., fine metal particles in a hot atmosphere of approximately 500° C. to 1000° C., and as such, makes it possible to produce CNTs with variations in aspects such as the type and arrangement of the catalyst or the type and condition of reaction of the carbon compound, and therefore have drawn attention as being suitable to mass production of CNTs. Further, the CVD method has the advantages of: being capable of producing both single-walled carbon nanotubes (SWCNTs) and multiwall carbon nanotubes (MWCNTs); and being capable of, by using a substrate supporting a catalyst, producing a large number of CNTs aligned perpendicularly to a surface of the substrate.

The CVD method includes a CNT synthesis step. This CNT synthesis step may be divided into a formation step and a growth step, in which case a metal catalyst supported by a substrate is reduced by being exposed to a hot hydrogen gas (hereinafter referred to as "reducing gas") in the formation step, and then in the growth step CNTs are synthesized by bringing the catalyst into contact with a raw material gas containing a catalyst activation material. The formation step and the growth step are executed in a single furnace to avoid exposure of the reduced catalyst to the outside air between the formation step and the growth step.

In the case of a normal CVD method, fine catalyst particles are covered with carbonaceous impurities generated in the process of synthesis of CNTs; therefore, the catalyst is easily deactivated, and the CNTs cannot grow efficiently. For this reason, it is common to synthesize CNTs in an atmosphere of low-carbon concentration with the volume fraction of a raw material gas during CVD reduced to approximately 0.1 to 1%. Since the amount of a raw material gas supplied is proportional to the production volume of CNTs, the synthesis of CNTs in an atmosphere of as high-carbon concentration as possible is directly linked to an improvement in production efficiency.

In recent years, there has been proposed a technique for the CVD method that remarkably increases the activity and longevity of a catalyst by bringing a catalyst activation material such as water, as well as a raw material gas, into contact with the catalyst (such a technique being hereinafter referred to as "super-growth technique"; see Non-Patent Literature 1). A catalyst activation material is believed to have an effect of cleansing the outer layer of a catalyst by removing carbonaceous impurities covering the fine catalyst particles, and such an effect is believed to remarkably increase the activity and longevity of the catalyst. Actually, there has been a case of success in remarkably improving efficiency in the production of CNTs by preventing deactivation of a catalyst even in such an environment of high-carbon concentration (approximately 2 to 20% of the volume fraction of a raw material gas during CVD) that the catalyst would normally be deactivated. CNTs that are synthesized by applying the super-growth technique to a substrate supporting a catalyst have the features of: being large in specific surface area, forming an aggregate of CNTs each aligned along a regular direction; and being low in bulk density (such an aggregate being hereinafter referred to as "aligned CNT aggregate".

Conventionally, CNT aggregates are one-dimensional elongated flexible substances that are very high in aspect ratio, and because of their strong van der Waals' force, are likely to constitute random and non-aligned aggregates that are small in specific surface area. Because it is extremely difficult to restructure the orientation of an aggregate that is once random and non-aligned, it has been difficult to produce a CNT aggregate that is large in specific surface area with moldability and processability. However, the super-growth technique has made it possible to produce aligned CNT aggregates that are large in specific surface area, have orientation, and can be molded and processed into various forms and shapes, and such aligned CNT aggregates are believed to be applicable as substance/energy storage materials for various uses such as super-capacitor electrodes and directional heat-transfer/heat-dissipation materials.

Conventionally, there have been proposed various production apparatuses for realizing serial production of CNTs by the CVD method, a known example thereof being a technique for transferring a series of base materials into a synthesis furnace with use of transferring means such as a belt conveyor or a turntable (see Patent Literatures 2 to 4). However, it was found that in the case of serial production of aligned CNT aggregates with use of the super-growth technique, there are technical problems specific to high-carbon environment and/ or a catalyst activation material, although there were no such problems with the conventional synthetic method.

CITATION LIST

Patent Literatures

[Patent Literature 1] Japanese Patent Application Publication, Tokukai, No. 2003-171108 A (Publication Date: Jun. 17, 2003)
[Patent Literature 2] Japanese Patent Application Publication, Tokukai, No. 2006-16232 A (Publication Date: Jan. 19, 2006)
[Patent Literature 3] Japanese Patent Application Publication, Tokukai, No. 2007-91556 A (Publication Date: Apr. 12, 2007)
[Patent Literature 4] Japanese Patent Application Publication, Tokukai, No. 2007-92152 A (Publication Date: Apr. 12, 2007)

Non-Patent Literatures

[Non-Patent Literature 1] HATA, K. et al.: "Water-assisted highly efficient synthesis of impurity-free Single-walled carbon nanotubes", Science, Nov. 19, 2004, Vol. 30 6, p. 1362-1364

SUMMARY OF INVENTION

Technical Problem

Production of aligned CNT aggregates by the super-growth technique causes carbonaceous by-products (hereinafter referred to as "carbon contaminants") other than CNTs such as amorphous carbon and graphite to adhere in large quantities to the wall surface in a furnace. This is because the super-growth technique puts a raw material gas in an environment of high-carbon concentration, and such adhesion of carbon contaminants becomes more prominent in the case of serial production. There has empirically been known such a problem that accumulation of a certain amount of carbon contaminants in the furnace as a result of serial production leads to a decrease in production volume and deterioration in quality of aligned CNT aggregates.

Conventionally, such a problem has been solved by a method (such a method being hereinafter referred to as "heated air cleaning") for removing the carbon contaminants by introducing an oxygen-containing gas (air) into the furnace, heating the furnace, and thereby gasifying the carbon contaminants. Unfortunately, such an operation interrupts production, thus causing a decrease in production efficiency.

Such heated air cleaning is effective when the furnace wall is composed of quartz, but impracticably causes problems when the furnace wall is composed of a metal such as a heat-resistant alloy, because the heated air cleaning oxidizes the furnace wall surface and therefore causes the generation of metal-oxide scale. In particular, a heat-resistance alloy that is once carburized shows a remarkable decrease in oxidation resistance. Since the condition for the growth step of the super-growth technique is a high-carbon environment, the furnace wall surface is more likely to be carburized, and shows a remarkable decrease in oxidation resistance. Heated air cleaning of a carburized furnace wall causes carbonaceous by-products such as amorphous carbon and graphite to be gasified and therefore removed, but the furnace wall surface is oxidized, whereby metal-oxide scale is generated on and peels off from the furnace wall surface. It has been found that production in an oxidized furnace causes a large amount of carbon to adhere to the oxidized wall surface and the metal-oxide scale, thus leading markedly to a decrease in production volume and deterioration in quality of aligned CNT aggregates.

Quartz is stable at high temperatures and less likely to emit impurities, and as such, is often used as wall material for a CNT synthesis furnace. However, quartz is not high in precision and degree of freedom of processing and is likely to be broken when shocked. An effective way of further improving the efficiency in the production of CNTs is to increase the size of the synthesis furnace. However, because of such shortcomings of quartz, it is very difficult to increase the size of the apparatus. Moreover, because heated air cleaning cannot be applied when metal is used as wall material, it is impossible to solve problems with a decrease in production volume and deterioration in quality of aligned CNT aggregates.

The following are two possible main factors in a mechanism by which carbon contaminants in a furnace cause a decrease in production volume and deterioration in quality of aligned CNT aggregates.

1. Chemical Reaction Between the Reducing Gas and the Carbon Contaminants in the Formation Step Since the formation step and the growth step are serially repeated in the same furnace, those carbon contaminants which adhere to the furnace wall in the growth step have been exposed to the reducing gas in the formation step. At a high temperature of approximately 800° C., the carbon contaminants and the hydrogen contained in the reducing gas react chemically to generate hydrocarbon gas (mainly methane gas). An increase in carbon contaminants that adhere to the furnace wall leads to an increase in amount of hydrocarbon gas that is generated by the carbon contaminants, and therefore starts to inhibit catalyst reduction necessary for CNT growth, thus causing a decrease in production volume and deterioration in quality of aligned CNT aggregates.

2. Chemical Reaction Between the Catalyst Activation Material and the Carbon Contaminants in the Growth Step Those carbon contaminants which have adhered to the furnace wall make contact with the catalyst activation material in the growth step. At a high temperature of approximately 800° C., the carbon contaminants and the catalyst activation material react chemically to generate an oxygen-containing gas, such as carbon monoxide or carbon dioxide, which has a small carbon number. Accumulation of carbon contaminants adherent to the furnace wall leads to an increase in amount of the catalyst activation material that reacts chemically with the carbon contaminants, whereby the gas composition of a raw material gas environment deviates from the condition optimum for CNT growth. This causes a decrease in production volume and deterioration in quality of aligned CNT aggregates.

The present invention has been devised to solve such inconveniences as caused by the conventional techniques, and it is a main object of the present invention to provide a production apparatus and a production method that are capable of improving efficiency in the production of aligned CNT aggregates by preventing a decrease in production volume and deterioration in quality of aligned CNT aggregates in serial production and by making it easy to increase the size of the apparatus.

Solution to Problem

In order to attain such an object, an apparatus in one aspect of the present invention for producing an aligned carbon-nanotube aggregate is an apparatus for producing an aligned carbon-nanotube aggregate by synthesizing the aligned carbon-nanotube aggregate on a base material having a catalyst on a surface thereof, the apparatus including: a formation unit that processes a formation step of causing an environment surrounding the catalyst to be an environment of a reducing gas and heating at least either the catalyst or the reducing gas; a growth unit that processes a growth step of synthesizing the aligned carbon-nanotube aggregate by causing the environment surrounding the catalyst to be an environment of a raw material gas and by heating at least either the catalyst or the raw material gas; and a transfer unit that transfers the base material at least from the formation unit to the growth unit.

The units may have their respective furnace spaces spatially connected via a connecting section. The apparatus may further include means to prevent gas mixing to prevent gas from a furnace space from mixing with gas from another furnace space.

The means to prevent gas mixing may be means that keeps a concentration of carbon atoms in the environment of the reducing gas in the formation unit smaller than or equal to $5 \times 10^{22}$ atoms/m$^3$.

In the apparatus for producing an aligned carbon-nanotube aggregate, at least one of those components of the apparatus which are exposed to either the reducing gas or the raw material gas may be composed of a heat-resistant alloy. The growth unit may include a section to add a catalyst activation material. The apparatus for producing an aligned carbon-nanotube aggregate may further include a cooling unit.

A method in another aspect of the present invention for producing an aligned carbon-nanotube aggregate is a method for producing an aligned carbon-nanotube aggregate by synthesizing the aligned carbon-nanotube aggregate on a base material having a catalyst on a surface thereof, the method including: a formation step of causing an environment surrounding the catalyst to be an environment of a reducing gas and heating at least either the catalyst or the reducing gas, the formation step being executed in a formation unit; a growth step of synthesizing the aligned carbon-nanotube aggregate by causing the environment surrounding the catalyst to be an environment of a raw material gas and by heating at least either the catalyst or the raw material gas, the growth step being executed in a growth unit.

In the method producing an aligned carbon-nanotube aggregate, a concentration of carbon atoms in the environment of the reducing gas may be kept smaller than or equal to $5 \times 10^{22}$ atoms/m$^3$. The environment of the raw material gas may be an environment of high-carbon concentration and contain a catalyst activation material.

For a fuller understanding of the nature and advantages of the invention, reference should be made to the ensuing detailed description taken in conjunction with the accompanying drawings.

ADVANTAGEOUS EFFECTS OF INVENTION

Since the unit that processes the formation step and the unit that processes the growth step are provided separately, the adhesion of carbon contaminants to the inner wall of the formation furnace is prevented. Therefore, the formation step is not inhibited even in serial production, and a decrease in production volume and deterioration in quality of aligned CNT aggregates can be prevented. Further, inflow of the raw material gas into the formation furnace inhibits reduction of the catalyst in the formation step. Since the concentration of carbon atoms in the environment of the reducing gas is kept smaller than or equal to $5 \times 10^{22}$ atoms/m$^3$ by the means to prevent gas mixing, the reduction of the catalyst in the formation step is not inhibited, whereby the production volume and quality of aligned CNT aggregates are maintained.

Further, the fact that at least one of those components of the apparatus which are exposed to either the reducing gas or the raw material gas is composed of a heat-resistant alloy makes it easy to increase the capacity of the production apparatus, thus bringing about a profound effect in promoting realization of mass production of CNTs.

Further, the addition of a catalyst activation material to the environment surrounding the catalyst makes it possible both to maintain the activity of the catalyst and improve the growth rate of the CNTs, and to prevent a decrease in production volume and deterioration in quality of aligned CNT aggregates.

Further, the addition of a cooling unit that processes a cooling step of cooling the base material as a step following the growth step makes it possible to prevent the CNTs, the catalysts, and the base material from being oxidized, and to prevent a decrease in production volume and deterioration in quality of aligned CNT aggregates.

DESCRIPTION OF EMBODIMENTS

Figure 1:
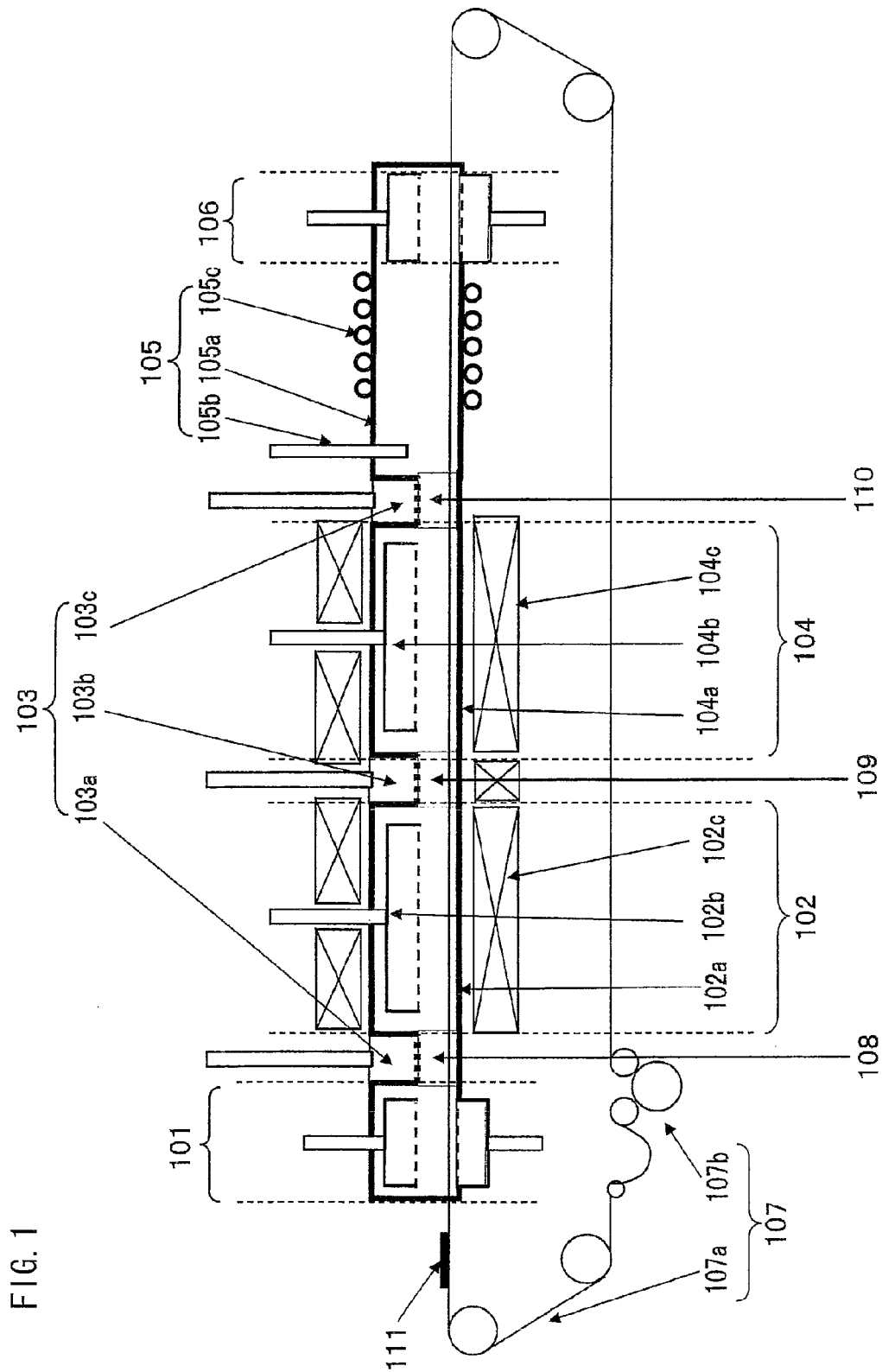
FIG. 1 is a block diagram schematically showing the configuration of a production apparatus according to Example of Production Apparatus 1 of the present invention.

The best modes for carrying out the present invention are described below.

(Aligned CNT Aggregate)

An aligned CNT aggregate that is produced in the present invention refers to a structure in which a large number of CNTs having grown from a base material are aligned along a particular direction. A preferred specific surface area of the aligned CNT aggregate is not less than 600 m$^2$/g when the CNTs are mostly unopened, or is not less than 1,300 m$^2$/g when the CNTs are mostly opened. An aligned CNT aggregate having a specific surface area of not less than 600 m$^2$/g with the CNTs unopened or an aligned CNT aggregate having a specific surface area of not less than 1,300 m$^2$/g with the CNTs opened is preferable because such an aligned CNT aggregate contains less impurities such as metals or less carbon impurities (e.g., not greater than several tens of percent [approximately 40%] of the weight).

The weight density ranges from 0.002 g/cm$^3$ to 0.2 g/cm$^3$. If the weight density is less than 0.2 g/cm$^3$, there will be a weakening in binding of CNTs constituting the aligned CNT aggregate. Such a weakening renders the aligned CNT aggregate likely to be homogenously dispersed when stirred into a solvent or the like. That is, a weight density of not greater than 0.2 g/cm$^3$ makes it easy to obtain a homogenous dispersion liquid. Alternatively, a weight density of not less than 0.002 g/cm$^3$ leads to an improvement in the integrity of the aligned CNT aggregate. Such an improvement makes it hard for the aligned CNT aggregate to be unbound, thus making it easy to handle the aligned CNT aggregate.

In order for an aligned CNT aggregate to exhibit orientation and a large specific surface area, it is preferable that the height of the aligned CNT aggregate be in a range of not less than 10 μm to not greater than 10 cm. A height of not less than 10 μm leads to an improvement in orientation. Alternatively, a height of not greater than 10 cm makes it possible to improve the specific surface area, because such a height makes rapid generation possible and the adhesion of carbonaceous impurities is therefore controlled.

(Base Material)

The base material is a member capable of supporting a catalyst for carbon nanotubes on a surface thereof, and can maintain its shape even at a high temperature of not lower than 400° C. Any type of base material that has been proven to be usable for production of CNTs can be used. Examples of materials include: metals such as iron, nickel, chromium, molybdenum, tungsten, titanium, aluminum, manganese, cobalt, copper, silver, gold, platinum, niobium, tantalum, lead, zinc, gallium, germanium, arsenic, indium, phosphor, and antimony; alloys and oxides containing these materials; nonmetals such as silicon, quartz, glass, mica, graphite, and diamond; and ceramic. The metal materials are lower in cost than silicon and ceramic. In particular, a Fe—Cr (iron-chromium) alloy, a Fe—Ni (iron-nickel) alloy, a Fe—Cr—Ni (iron-chromium-nickel) alloy, and the like are suitable.

The base material may take the form of a thin film, a block, or a powder, as well as a flat plate. However, in particular, such a form that the base material has a large surface area for its volume is advantageous to mass production.

(Carburizing Prevention Layer)

The base material may have a carburizing prevention layer formed on either a front or back surface thereof. Of course, it is desirable that the base material have a carburizing prevention layer formed on each of the front and back surfaces thereof. The carburizing prevention layer is a protecting layer for preventing the base material from being carburized and therefore deformed in the step of generating carbon nanotubes.

It is preferable that the carburizing prevention layer be composed of a metal or ceramic material, or especially preferably the ceramic material, which is highly effective in preventing carburizing. Examples of the metal include copper and aluminum. Examples of the ceramic material include: oxides such as aluminum oxide, silicon oxide, zirconium oxide, magnesium oxide, titanium oxide, silica alumina, chromium oxide, boron oxide, calcium oxide, and zinc oxide; and nitrides such as aluminum nitride and silicon nitride. Among them, aluminum oxide and silicon oxide are preferable because they are highly effective in preventing carburizing.

(Catalyst)

The base material or the carburizing prevention layer has a catalyst supported thereon. Any type of catalyst that has been proven to be usable for production of CNTs can be used. Examples of the catalyst include iron, nickel, cobalt, molybdenum, a chloride thereof, an alloy thereof, and a complex or layer thereof with aluminum, alumina, titania, titanium nitride, or silicon oxide. Examples that can be given are an iron-molybdenum thin film, an alumina-iron thin film, an alumina-cobalt thin film, an alumina-iron-molybdenum thin film, an aluminum-iron thin film, and an aluminum-iron-molybdenum thin film. The catalyst can be used in a range of existential quantities that has been proven to be usable for production of CNTs. For example, in the case of use of iron, it is preferable that the thickness of a film formed be in a range of not less than 0.1 nm to not greater than 100 nm, more preferably not less than 0.5 nm to not greater than 5 nm, or especially preferably 0.8 nm to not greater than 2 nm.

It is possible to apply either a wet or dry process to the formation of the catalyst onto the surface of the base material. Specifically, it is possible to apply a sputtering evaporation method or a method for spreading/calcining a liquid obtained by dispersing fine metal particles in an appropriate solvent. Further, it is possible to form the catalyst into any shape with concomitant use of patterning obtained by applying well-known photolithography, nanoprinting, or the like.

A production method of the present invention makes it possible to arbitrary control the shape of an aligned CNT aggregate, according to the catalyst patterning formed on the substrate and the growth time for CNTs, so that the aligned CNT aggregate takes a thin-film shape, a cylindrical shape, a prismatic shape, or any other complicated shape. In particular, in the shape of a thin film, the aligned CNT aggregate has an extremely small thickness (height) as compared with its length and width; however, the length and width can be arbitrarily controlled according to the catalyst patterning, and the thickness can be arbitrarily controlled according to the growth time for CNTs that constitute the aligned CNT aggregate.

(Reducing Gas)

In general, a reducing gas is a gas that has at least one of the effects of reducing a catalyst, stimulating the catalyst to become fine particles suitable for the growth of CNTs, and improving the activity of the catalyst, and that is in a gaseous state at a growth temperature. Any type of reducing gas that has been proven to be usable for production of CNTs can be used. However, a typically applicable example of the reducing gas is a gas having reducing ability, such as hydrogen gas, ammonium, water vapor, or a mixture thereof. Alternatively, it is possible to apply a mixed gas obtained by mixing hydrogen gas with an inert gas such as helium gas, argon gas, or nitrogen gas. The reducing gas is generally used in a formation step, but may be used in a growth step as appropriate.

(Raw Material Gas)

As a raw material for use in generation of CNTs in the present invention, any type of raw material that has been proven to be usable for production of CNTs can be used. In general, gasses having raw-material carbon sources at the growth temperature can be used. Among them, hydrocarbons such as methane, ethane, ethylene, propane, butane, pentane, hexane, heptanepropylene, and acetylene are suitable. In addition, lower alcohols such as methanol and ethanol, acetone, low-carbon oxygen-containing compounds such as carbon monoxide, and mixtures thereof can be used. Further, the raw material gas may be diluted with an inert gas.

(Inert Gas)

The inert gas only needs to be a gas that is inert at the temperature at which CNTs grow, and that does not reacts with the growing CNTs. Any type of inert gas that has been proven to be usable for production of CNTs can be used. Examples that can be given are helium, argon, hydrogen, nitrogen, neon, krypton, carbon dioxide, chlorine, and mixtures thereof. In particular, nitrogen, helium, argon, hydrogen, and mixtures thereof are suitable.

(Catalyst Activation Material)

It is possible to add a catalyst activation material in the CNT growth step. The addition of the catalyst activation material makes it possible to further improve the efficiency in the production of carbon nanotubes and the purity of the carbon nanotubes. In general, the catalyst activation material used here only needs to be an oxygen-containing substance that does no significant damage to CNTs at the growth temperature. Effective examples other than water include: low-carbon oxygen-containing compounds such as hydrogen sulfide, oxygen, ozone, acidic gases, nitrogen oxide, carbon monoxide, and carbon dioxide; alcohols such as ethanol and methanol; ethers such as tetrahydrofuran; ketones such as acetone; aldehydes; esters; nitrogen oxide; and mixtures of thereof. Among them, water, oxygen, carbon dioxide, carbon monoxide, and ethers such as tetrahydrofuran are preferable. In particular, water is suitable.

The catalyst activation material is not particularly limited in amount to be added. Normally, however, the catalyst activation material only needs to be added in minute amounts. For example, when the catalyst activation material is water, the catalyst activation material only needs to be added in a range of not less than 10 ppm to not greater than 10,000 ppm, preferably not less than 50 ppm to not greater than 1,000 ppm, more preferably not less than 100 ppm to not greater than 700 ppm.

The mechanism by which the catalyst activation material functions is currently supposed to be as follows: In the process of growth of CNTs, adhesion of by-products such as amorphous carbon and graphite to the catalyst causes deactivation of the catalyst and the growth of CNTs is therefore inhibited. However, the presence of the catalyst activation material causes amorphous carbon and graphite to be oxidized into carbon monoxide or carbon dioxide and therefore gasified. Therefore, the catalyst activation material is believed to cleanse the catalyst and express the function (catalyst activation function) of enhancing the activity of the catalyst and extending the active longevity of the catalyst.

With the catalyst activation material thus added, the activity of the catalyst is enhanced and the longevity of the catalyst is extended. When the catalyst activation material is added, the growth of CNTs, which would continue for approximately two minutes at longest if the catalyst activation material were not added, continues for several tens of minutes, and the growth rate increases by a factor of not less than 100 or, furthermore, a factor of 1,000. As a result, an aligned CNT aggregate with a marked increase in height is obtained.

(Environment of High-Carbon Concentration)

An environment of high-carbon concentration means a growth atmosphere in which the proportion of the raw material gas to the total flow is approximately 2 to 20%. According to a chemical vapor deposition method that does not involve the use of a catalyst activation material, an increase in carbon concentration causes fine catalyst particles to be covered with carbonaceous impurities generated in the process of synthesis of CNTs; therefore, the catalyst is easily deactivated, and the CNTs cannot grow efficiently. For this reason, the CNTs are synthesized in a growth atmosphere (environment of low-carbon concentration) in which the proportion of the raw material gas to the total flow is approximately 0.1 to 1%.

Since the activity of the catalyst is remarkably improved in the presence of the catalyst activation material, the catalyst is not deactivated even in an environment of high-carbon concentration. Thus, long-term growth of CNTs is made possible, and the growth rate is remarkably improved. However, in an environment of high-carbon concentration, a large amount of carbon contaminants adheres to a furnace wall and the like, as compared with an environment of low-carbon concentration.

(Furnace Pressure)

It is preferable that the furnace pressure be not lower than $10^2$ Pa and not higher than $10^7$ Pa (100 in atmospheric pressure), or more preferably not lower than $10^4$ Pa and not higher than $3 \times 10^5$ Pa (3 in atmospheric pressure).

(Reaction Temperature)

The reaction temperature at which CNTs are synthesized is appropriately determined in consideration of the metal catalyst, the raw-material carbon source, and the reaction pressure. In the case of inclusion of the step of adding the catalyst activation material in order to eliminate a by-product that serves as a factor of catalyst deactivation, it is desirable that the reaction temperature be set in such a temperature range that the catalyst activation material sufficiently expresses its effect. That is, the most desirable temperature range has a lower-limit temperature at or above which the catalyst activation material can remove by-products such as amorphous carbon and graphite and a higher-limit temperature at or below which the CNTs, which are main products, are not oxidized by the catalyst activation material.

Specifically, in the case of use of water as the catalyst activation material, it is preferable that the reaction temperature be in a range of 400° C. to 1,000° C. At 400° C. or lower, the catalyst activation material does not express its effect. At 1,000° C. or higher, the catalyst activation material reacts with the CNTs.

Alternatively, in the case of use of carbon dioxide as the catalyst activation material, it is preferable that the reaction temperature be in a range of 400° C. to 1,100° C. At 400° C. or lower, the catalyst activation material does not express its effect. At 1,100° C. or higher, the catalyst activation material reacts with the CNTs.

(Formation Step)

The formation step is a step of causing an environment surrounding the catalyst supported by the base material to be an environment of the reducing gas and heating at least either the catalyst or the reducing gas. This step brings about at least one of the effects of reducing the catalyst, stimulating the catalyst to become fine particles suitable for the growth of CNTs, and improving the activity of the catalyst. For example, when the catalyst is an alumina-iron thin film, the iron catalyst is reduced to become fine particles, whereby a large number of fine iron particles in nanometer size are formed on the alumina layer. Thus, the catalyst is prepared to be a catalyst suitable to production of aligned CNT aggregates.

(Growth Step)

The growth step is a step of synthesizing an aligned CNT aggregate by causing the environment surrounding the catalyst, which in the formation step has been put in a state suitable to production of aligned CNT aggregates, to be an environment of the raw material gas and by heating at least either the catalyst or the raw material gas.

(Cooling Step)

A cooling step is a step of, after the growth step, cooling down the aligned CNT aggregate, the catalyst, and the base material in the presence of an inert gas. After the growth step, the aligned CNT aggregate, the catalyst, and the base material are high in temperature, and as such, are oxidized when placed in the presence of oxygen. This is prevented by cooling down the aligned CNT aggregate, the catalyst, and the base material to 400° C. or lower, or more preferably 200° C. or lower.

(Production Apparatus)

A production apparatus of the present invention is substantially constituted by an inlet purge section, a formation unit, a growth unit, a transfer unit, means to prevent gas mixing, connecting sections, a cooling unit, and an outlet purge section. Each of these components is described below.

(Inlet Purge Section)

The inlet purge section is a set of devices for preventing the outside air from flowing into a furnace of the apparatus through a base-material inlet, and has such a function that an environment surrounding a base material transferred into the apparatus is replaced by a purge gas. Examples of the inlet purge section include a furnace or chamber in which the purge gas is retained and a gas injection section for injecting the purge gas. It is preferable that the purge gas be an inert gas. In particular, in terms of safety, cost, and purging properties, it is preferable that the purge gas be nitrogen. When the base-material inlet is always open as in the case of a belt-conveyor type, it is preferable to use, as a purge gas injection section, a gas curtain device that injects the purge gas from up and down in the form of a shower, in order to prevent the outside air from flowing in through an inlet of the apparatus.

(Formation Unit)

The formation unit is a set of devices for realizing a formation step, and has a function of causing an environment surrounding a catalyst formed on a surface of the base material to be an environment of a reducing gas and heating at least either the catalyst or the reducing gas. Examples of the formation unit include a formation furnace in which the reducing gas is retained, a reducing gas injection section for injecting the reducing gas, and a heater for heating at least either the catalyst or the reducing gas. The heater may be any heat that is capable of heating, and it is preferable that the heating temperature be in a range of 400° C. to 1,100° C., examples of which include a resistance heating heater, an infrared heating heater, and an electromagnetic induction heater.

(Growth Unit)

The growth unit is a set of devices for realizing a growth step, and has a function of synthesizing an aligned CNT aggregate by causing the environment surrounding the catalyst, which in the formation step has been put in a state suitable to production of an aligned CNT aggregate, to be an environment of a raw material gas and by heating at least either the catalyst or the raw material gas. Specific examples of the growth unit include a growth furnace in which the environment of the raw material gas is retained, a raw material gas injection section for injecting the raw material gas, and a heater for heating at least either the catalyst or the raw material gas. The heater may be any heat that is capable of heating, and it is preferable that the heating temperature be in a range of 400° C. to 1,100° C., examples of which include a resistance heating heater, an infrared heating heater, and an electromagnetic induction heater. It is preferable to further include a section to add a catalyst activation material.

(Section to Add a Catalyst Activation Material)

The section to add a catalyst activation material is a set of devices for either adding a catalyst activation material into the raw material gas, or adding a catalyst activation material directly to the environment surrounding the catalyst inside of the growth furnace. Means for supplying the catalyst activation material is not particularly limited. Examples of the means include supplying the catalyst activation material through a bubbler, supplying the catalyst activation material by vaporizing a solution containing the catalyst activation material, supplying the catalyst activation material as it is in a gaseous state, and supplying the catalyst activation material by liquefying/vaporizing a solid catalyst activation material. It is possible to build a supply system using various apparatuses such as a vaporizer, a mixer, a stirrer, a diluter, a pump, and a compressor. Furthermore, it is possible to provide a tube for the supply of the catalyst activation material with a device for measuring the concentration of the catalyst activation material. Through feedback control using values outputted from the measuring device, stable supply of the catalyst activation material with a small number of changes over time can be ensured.

(Transfer Unit)

The transfer unit is a set of devices necessary for transferring the substrate at least from the formation unit to the growth unit. Examples of the transfer unit include either a robot arm and a robot arm driving device in the case of a multi-chamber type, or a mesh belt and a reducer-equipped electric motor in the case of a belt-conveyor type.

(Means to Prevent Gas Mixing)

The means to prevent gas mixing is a set of devices installed at the connecting sections, via which the respective inner parts of the units are spatially connected, and performs a function of preventing gas from flowing out of a furnace space of one of the units into that of another. Examples of the means to prevent gas mixing include a gate valve device that mechanically disconnects the spatial connection between one unit and another during a period of time except when the substrate moves from one unit to another, a gas curtain device that disconnects by injecting an inert gas, and an exhaust device through which gasses in the connecting sections and/or those areas in the units which are near the connecting sections are passed out of the system.

In order to surely prevent gas mixing, it is preferable that a shutter and/or a gas curtain be used in combination with the exhaust device. Further, in order to transfer the substrate from one unit to another without interruption from the point of view of efficient continuous growth, and from the point of view of simplification of mechanism, it is more preferable that the exhaust device be used alone. The means to prevent gas mixing needs to function so that the concentration of carbon atoms in the environment of the reducing gas in the formation furnace is kept smaller than or equal to $5 \times 10^{22}$ atoms/m$^3$, or more preferably smaller than equal to $1 \times 10^{22}$ atoms/m$^3$.

When the exhaust device is used to prevent gas mixing, the respective exhaust quantities of a plurality of exhaust sections cannot be each independently determined, and need to be adjusted according to the amount of gas supplied to the whole apparatus (e.g., the flow rate of the reducing gas, the flow rate of the raw material gas, and the flow rate of a coolant gas). However, a necessary condition for gas mixing prevention to be satisfied can be represented by the following equation:

$$Q \geq 4DS/L$$

where D is the diffusion coefficient of a gas that needs to be prevented from flowing in, S is the sectional area of a boundary at which the gas is prevented from flowing in, and L is the length of each exhaust section (along the length of the furnace). The exhaust quantity of each exhaust section is set so that the conditional equation is satisfied and a balance between gas supply and gas exhaust in the whole apparatus is kept.

(Concentration of Carbon Atoms)

Inflow of the raw material gas into the formation furnace exerts a harmful influence on the growth of CNTs. It is preferable that the inflow of the raw material gas into the formation furnace be prevented by the means to prevent gas mixing so that the concentration of carbon atoms in the environment of the reducing gas in the formation unit is kept smaller than or equal to $5\times10^{22}$ atoms/m$^3$, or more preferably smaller than or equal to $1\times10^{22}$ atoms/m$^3$. The "concentration of carbon atoms" here is calculated according to Eq. (1):

[Eq. (1)]

$$\text{(Concentration of Carbon Atoms)} = \sum_i C_i \frac{\rho_i D_i}{M_i} N_A \quad (1)$$

where with respect to the types of gas contained in the reducing gas (i=1, 2, . . . ), the concentration (ppmv) is denoted by $D_1$, $D_2$, . . . , the density in standard condition (g/m$^3$) is denoted by $\rho_1$, $\rho_2$,. . . , the molecular weight is denoted by $M_1$, $M_2$, . . . , and the number of carbon atoms contained in each gas molecule is denoted by $C_1$, $C_2$, . . . , and the Avogadro's number is denoted by $N_A$.

The production volume and quality of CNTs can be satisfactorily maintained by keeping the concentration of carbon atoms in the environment of the reducing gas in the formation furnace at not greater than $5\times10^{22}$ atoms/m$^3$. That is, the concentration of carbon atoms of $5\times10^{22}$ atoms/m$^3$ or smaller makes it possible, in the formation step, to satisfactorily exhibit the effects of reducing the catalyst, stimulating the catalyst to become fine particles suitable for the growth of CNTs, and improving the activity of the catalyst, whereby the production volume and quality of CNTs during the growth step can be satisfactorily maintained.

(Connecting Sections)

The connecting sections are a set of devices via which the respective furnace spaces of the units are spatially connected and which serve to prevent the base material from being exposed to the outside air as it is transferred from one unit to another. Examples of the connecting sections include a furnace or chamber capable of shielding an environment surrounding the base material from the outside air and passing the base material from one unit to another.

(Cooling Unit)

The cooling unit is a set of devices necessary for cooling down a base material on which an aligned CNT aggregate has grown. The cooling unit has a function of exerting antioxidant and cooling effects on the aligned CNT aggregate, the catalyst, and the base material after the growth step. Examples of the cooling unit include: a cooling furnace in which an inert gas is retained; a water-cooled cooling tube disposed to surround an internal space of the cooling furnace, in the case of a water-cooled type; and an injection section that injects an inert gas into the cooling furnace, in the case of an air-cooled type. Further, the water-cooled type and the air-cooled type may be combined.

(Outlet Purge Section)

The outlet purge section is a set of devices for preventing the outside air from flowing into a furnace of the apparatus through a base-material outlet. The outlet purge section has a function of causing the environment surrounding the base material to be an environment of a purge gas. Specific examples of the outlet purge section include a furnace or chamber in which the environment of the purge gas is retained and an injection section for injecting the purge gas. It is preferable that the purge gas be an inert gas. In particular, in terms of safety, cost, and purging properties, it is preferable that the purge gas be nitrogen. When the base-material inlet is always open as in the case of a belt-conveyor type, it is preferable to use, as a purge gas injection section, a gas curtain device that injects the purge gas from up and down in the form of a shower, in order to prevent the outside air from flowing in through an outlet of the apparatus.

(Reducing Gas Injection Section, Raw Material Gas Injection Section, and Catalyst Activation Material Injection Section)

As the reducing gas injection section, the raw material gas injection section, and the catalyst activation material injection section, shower heads each including a plurality of injection holes provided in a place facing that surface of the substrate on which the catalyst has been formed may be used. The "place facing" means that each of the injection holes is provided so that its injection axis line forms an angle of not less than 0 to less than 90 degrees with a line normal to a surface of the substrate, i.e., so that the flow direction of gas as injected from the injection holes provided in the shower head is substantially orthogonal to the surface of the substrate.

Use of such a shower head as the reducing gas injection section makes it possible to spray the reducing gas uniformly onto the substrate and therefore efficiently reduce the catalyst. This makes it possible, as a result, to enhance the uniformity of an aligned CNT aggregate that grows on the substrate and lower the consumption of the reducing gas.

Use of such a shower head as the raw material gas injection section makes it possible to spray the raw material gas uniformly onto the substrate and therefore efficiently consume the raw material gas. This makes it possible, as a result, to enhance the uniformity of an aligned CNT aggregate that grows on the substrate and lower the consumption of the raw material gas.

Use of such a shower head as the catalyst activation material injection section makes it possible to spray the catalyst activation material uniformly onto the substrate and therefore enhance the activity of the catalyst and extend the longevity of the catalyst. This allows aligned CNTs to continue to grow over a long period of time. The same is true in a case where the catalyst activation material is added to the raw material gas and a shower head is used as an injection section for the mixture.

(Those Components of the Apparatus which are Exposed to Either the Reducing Gas or the Raw Material Gas)

Examples of those components of the apparatus which are exposed to either the reducing gas or the raw material gas are the formation unit, the growth unit, the transfer unit, the means to prevent gas mixing, and some components of the connecting sections. Specific examples include such components of the apparatus as the formation furnace, the reducing gas injection section, the growth furnace, the raw material gas injection section, the mesh belt, the exhaust sections of the means to prevent gas mixing, and the furnaces of the connecting sections.

(Materials for Those Components of the Apparatus which are Exposed to Either the Reducing Gas or the Raw Material Gas)

Examples of materials for those components of the apparatus which are exposed to either the reducing gas or the raw material gas include materials capable of resisting high temperatures, such as quartz, heat-resistant ceramic, heat-resistance alloys. However, the heat-resistance alloys are preferable in terms of precision of processing, degree of freedom of processing, and cost. Examples of the heat-resistance alloys include heat-resistant steel, stainless steel, and nickel-based alloys. In general, heat-resistant steel refers to steel that contains Fe in major proportions and other alloys in concentrations of not greater than 50%, and stainless steel refers to steel that contains approximately not less than 12% of Cr. Further, examples of the nickel-based alloys include alloys obtained by adding Mo, Cr, Fe, and the like to Ni. Specifically, SUS 310, Inconel 600, Inconel 601, Inconel 625, Incoloy 800, MC Alloy, Haynes 230 Alloy are preferable in terms of heat resistance, mechanical strength, chemical stability, and low cost.

Carbon contaminants that adhere to the wall surfaces and the like when CNTs are synthesized in a high-carbon environment can be reduced by forming the inner walls of the furnaces and/or the components for use in the furnaces from a metal, e.g., a heat-resistant alloy and by either plating a surface of the heat-resistant alloy with molten aluminum or polishing the surface so that the surface has an arithmetic average roughness Ra≦2 μm. This favorably makes it possible to prevent a decrease in production volume and deterioration in quality of aligned CNT aggregates.

(Molten Aluminum Plating)

Molten aluminum plating means a process of forming an aluminum or aluminum alloy layer on a surface of an object by dipping the object into a bath of molten aluminum. An example of the process is as follows: A process of washing (preprocessing) a surface of an object (base metal) and then dipping the object into a bath of molten aluminum at approximately 700° C., thereby causing the molten aluminum to disperse into the surface of the base metal, forming an alloy of the base metal and aluminum, and causing aluminum to adhere to the alloy layer when the base metal is withdrawn from the bath. Furthermore, after the process, a process of exposing a Fe—Al alloy layer under the alumina and aluminum surface layer by subjecting the surface layer to low-temperature thermal diffusion may be executed.

(Polishing)

Examples of the method for polishing the heat-resistant alloy so that the arithmetic average roughness is Ra≦2 μm include: mechanical polishing, which is typified by buffing; chemical polishing, which involves the use of a chemical; electrolytic polishing, which is carried out while passing an electric current through an electrolyte; and complex electrolytic polishing, which is a combination of mechanical polishing and electrolytic polishing.

(Arithmetic Average Roughness)

For a definition of arithmetic average roughness Ra, see "JIS B 0610: 2001".

(Example of Production Apparatus 1)

FIG. 1 shows an example of an apparatus according to the present invention for producing an aligned CNT aggregate. This apparatus includes: a formation unit 102, which has a formation furnace 102a; a growth unit 104, which has a growth furnace 104a; a cooling unit 105, which has a cooling furnace 105a; and a transfer unit 107, which has a mesh belt 107a and a belt driving section 107b. The formation furnace 102a, the growth furnace 104a, and the cooling furnace 105a are spatially connected via connecting sections. The transfer unit 107 transfers a base material 111 out of the formation furnace space into the cooling furnace through the growth furnace.

First, provided at an inlet of the apparatus is an inlet purge section 101, which injects a purge gas from up and down in the form of a shower and thereby prevents the outside air from flowing into the furnace of the apparatus through the inlet.

The inlet purge section 101 and the formation unit 102 are spatially connected via a connecting section in which an exhaust section 103a of means to prevent gas mixing is disposed, and through the exhaust section 103a, a mixture of the purge gas injected from the inlet purge section 101 and a reducing gas injected from a reducing gas injection section 102b is discharged. This prevents the purge gas from flowing into the formation furnace and the reducing gas from flowing in toward the inlet purge section.

The formation unit 102 and the growth unit 104 are spatially connected via a connecting section in which an exhaust section 103b of the means to prevent gas mixing is disposed, and through the exhaust section 103b, a mixture of the reducing gas inside of the formation furnace and a raw material gas inside of the growth furnace is discharged. This prevents the raw material gas from flowing into the formation furnace and the reducing gas from flowing into the growth furnace.

The growth unit 104 and the cooling unit 105 are spatially connected via a connecting section in which an exhaust section 103c of the means to prevent gas mixing is disposed, and through the exhaust section 103c, a mixture of the raw material gas inside of the growth furnace and an inter gas inside of the cooling furnace is discharged. This prevents the raw material gas from flowing into the cooling furnace and the inert gas from flowing into the growth furnace.

Provided at an outlet of the apparatus is an outlet purge section 106 substantially identical in structure to the inlet purge section 101. The outlet purge section 106 injects a purge gas from up and down in the form of a shower and thereby prevents the outside air from flowing into the cooling furnace through the outlet.

The transfer unit 107 is of a belt-conveyor type in which a base material having a catalyst formed on a surface thereof is transferred out of the formation furnace into the cooling furnace through the growth furnace by the mesh belt 107a driven by the belt driving section 107b, for example, with use of a reducer-equipped electric motor. Moreover, the formation furnace and the growth furnace have their respective internal spaces spatially connected via a connecting section, and the growth furnace and the cooling furnace have their respective internal spaces spatially connected via a connecting section, in order that the mesh belt 107, on which the base material has been placed, can pass out of the formation furnace into the cooling furnace through the growth furnace. At these boundaries, the exhaust sections of the means to prevent gas mixing described above are provided, so as to prevent gas from flowing out of one of the furnaces into another.

As described above, in the CNT production apparatus according to the present invention, a series of base materials each having a catalyst on a surface thereof is transferred by the transfer unit 107 to pass through the inlet purge section 101, the formation unit 102, the growth unit 104, the cooling unit 105, and the outlet purge section in this order. In the meantime, the catalyst is reduced in an environment of the reducing gas in the formation unit, and CNTs grow on the surfaces of the base materials in an environment of the raw material gas in the growth unit 104 and then is cooled down in the cooling unit 105.

Figure 2:
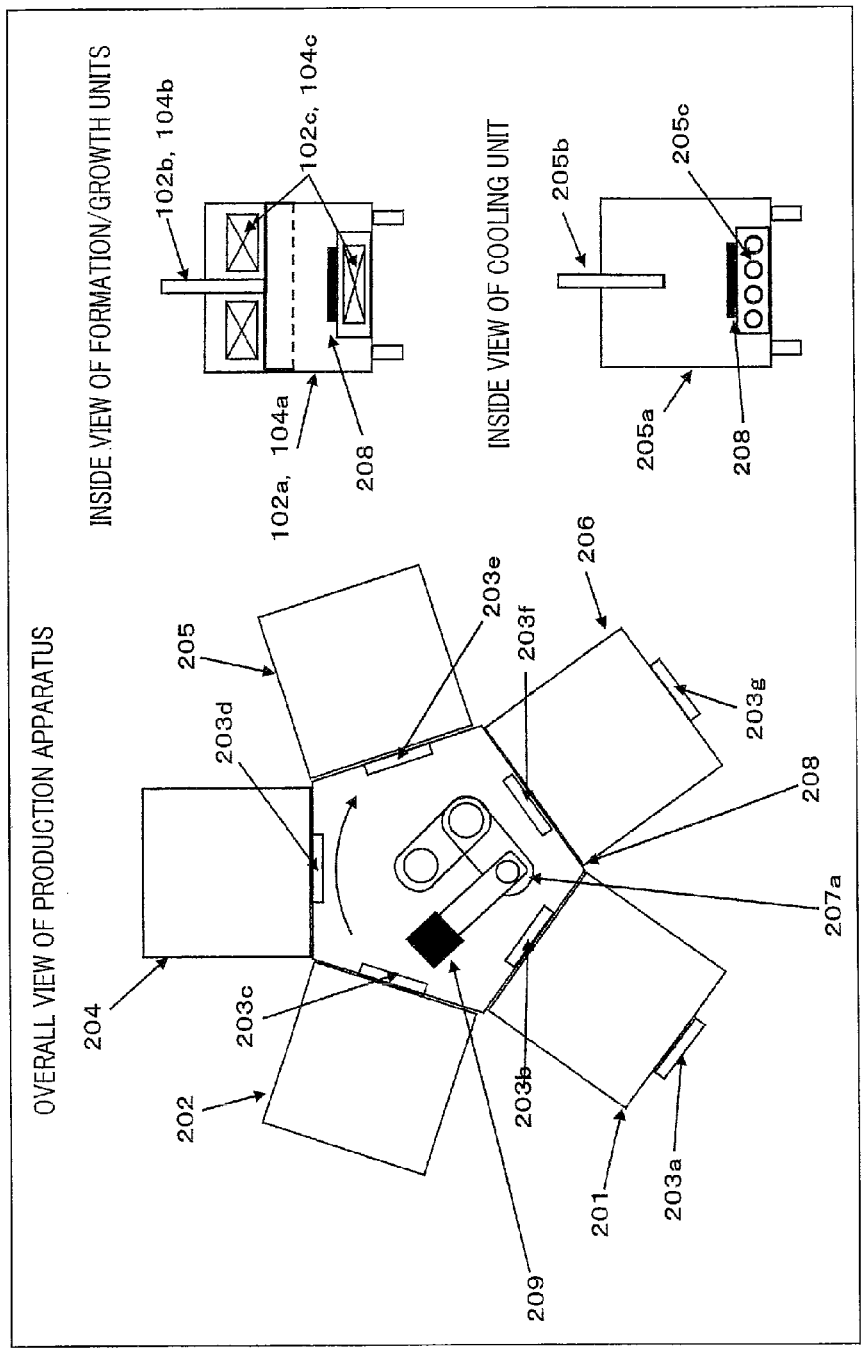
FIG. 2 is a block diagram schematically showing the configuration of a production apparatus according to Example of Production Apparatus 2 of the present invention.

FIG. 2 shows an example of an apparatus according to the present invention for producing an aligned CNT aggregate. This apparatus includes: an inlet purge section 201, which has a chamber and an inert gas injection section (both not shown); a formation unit 202, which has a formation furnace 202a; a growth unit 204, which has a growth furnace 204a; a cooling unit 205, which has a cooling furnace 205a; and a transfer unit 207, which has a robot arm 207a. Although the inlet purge section 201, each of the units, and an outlet purge section 206 are spatially connected via a single connecting section 208, a gaseous environment in one of the furnaces can be separated from that in another by gate valves 203b to 203f of means 203 to prevent gas mixing. A base material 209 having a catalyst on s surface thereof is transferred through the inlet purge section 201, the formation unit 202, the growth unit 204, the cooling unit 205, and the outlet purge section 206 in this order by the robot arm 207a. Through the formation, growth, and cooling steps, an aligned CNT aggregate grows on the base material.

The inlet purge section 201 is provided with a purge gas supply and exhaust section (not shown), and the inlet through which the base material enters is closed by the gate valve 203a. When the base material 209 is placed in the inlet purge section 201, the inlet gate valve 203a shuts and the gas in the chamber is replaced by a purge gas.

After the replacement by the purge gas, the gate value 203b, which separates the inlet purge section 201 from the connecting section 208, opens, and the base material 209 is transferred into the connecting section 208 by the robot arm 207a.

The, the gate valve 203c, which separates the formation furnace 202a from the connecting section 208, opens, and the base material 209 is transferred into the formation furnace 202a.

During the formation step, the gate valve 203c, which separates the formation furnace 202a from the connecting section 208, shuts so that reducing gas is prevented from flowing into the connecting section 208.

After completion of the formation step, the gate valve 203c, which separates the formation furnace 202a from the connecting section 208, opens, and the base material 209 is transferred into the connecting section 208. Then, the gate valve 203c shuts and the gate valve 203d, which separates the growth furnace 204a from the connecting section 208, opens, and the base material 209 is transferred into the growth furnace 204a. The gate valve 203c and the gate valve 203d do not open at the same time. Thus, the raw material gas is completely prevented from flowing into the formation furnace.

During the growth step, the gate valve 203d, which separates the growth furnace 204a from the connecting section 208, shuts so that the raw material gas is prevented from flowing into the connecting section.

After completion of the growth step, the gate valve 203d, which separates the growth furnace 204a from the connecting section 208, opens, and the base material 209 is transferred into the connecting section 208. Then, the gate valve 203d shuts and the gate valve 203e, which separates the cooling furnace 205a from the connecting section 208, opens, and the base material 209 is transferred into the cooling furnace 205a.

After completion of the cooling step, the base material 209 is transferred into the connecting section 208. Then, the gate valve 203f, which separates the outlet purge section 206 from the connecting section 208, opens, and the base material 209 is transferred into the outlet purge section 206.

The outlet purge section 206 is provided with a purge gas supply and exhaust section (not shown), therefore, the gas in the outlet purge section 206 has been replaced by a purge gas by the time the base material is transferred into the outlet purge section 206. After the base material 209 is transferred into the outlet purge section 206, the gate valve 203f, which separates the outlet purge section 206 from the connecting section 208, is closed, and the gate valve 203g, which separates the outlet purge section 206 from the outside of the apparatus, is opened. Thus, the base material 209 is transferred out of the apparatus, but since the gate valve 203f is closed, the outside air is prevented from flowing into the connecting section 208.

As described above, in the CNT production apparatus according to the present invention, the base material 209, which has a catalyst on a surface thereof, is transferred by the robot arm 207a to pass through the inlet purge section 201, the formation unit 202, the growth unit 204, the cooling unit 205, and the outlet purge section 206 in this order. In the meantime, the catalyst is reduced in an environment of the reducing gas in the formation unit, and CNTs grow on the surfaces of the base materials in an environment of the raw material gas in the growth unit 204 and then is cooled down in the cooling unit 205. Thus, the production of CNTs is finished.

The present invention is not limited to the description of the preferred embodiments above, but may be applied in many variations within the scope of gist thereof.

For example, through an appropriate setting of reaction conditions such raw material gas and heating temperature, it is possible to selectively produce either single-walled or multiwall CNTs, and it is also possible to produce both single-walled and multiwall CNTs.

Further, although in the present embodiment the catalyst is formed onto the surface of the base material by a film-forming apparatus provided separately from the production apparatus, the production apparatus may be configured such that a catalyst film-forming unit is provided upstream of the formation unit so that the base material passes through the catalyst film-forming apparatus before it passes through the formation unit.

Further, although in the present embodiment the formation, growth, and cooling units are arranged in this order and have their respective furnace spaces spatially connected via the connecting sections, a plurality of units that process steps other than the formation, growth, and cooling steps may be further provided somewhere and have their respective furnace spaces spatially connected via connecting sections.

Further, although in the present embodiment the two types of transfer unit, namely the belt-conveyor type and the robot-arm type, have been described, the present invention is not limited to them. For example, a turntable type or a lifting-and-lowering type may be employed.

Further, although in the present embodiment the two types of arrangement of the formation, growth, and cooling units, namely linear arrangement and circular arrangement, have been described, the present invention is not limited to them. For example, the formation, growth, and cooling units may be arranged vertically in this order.

EXAMPLE

Examples are given below to explain the effectiveness of the present invention. It should be noted that the quality of CNTs was evaluated in the following manner.

(Measurement of Specific Surface Area)

The term "specific surface area" means a value obtained from an adsorption and desorption isotherm of liquid nitrogen at 77K using the Brunauer-Emmett-Teller equation. The specific surface area was measured using a BET specific surface area measuring apparatus (HM model-1210; manufactured by MOUNTECH Co., Ltd.).

(G/D Ratio)

The term "G/D ratio" means an index that is commonly used to evaluate the quality of CNTs. A raman spectrum of CNTs as measured by a raman spectroscopic instrument is observed in vibration modes called "G band" (near 1,600 $cm^{-1}$) and "D band" (near 1,350 $cm^{-1}$). The G band is a vibration mode derived from hexagonal lattice structures of graphite appearing as cylindrical surfaces of CNTs, and the D band is a vibration mode derived from crystal defects. Therefore, with a higher peak intensity ratio of the G band to the D band (G/D ratio), the CNTs can be evaluated to be higher in quality and lower in defect rate.

In the present example, the G/D ratio was calculated by peeling off part of an aligned CNT aggregate located near the center of a base material and measuring a raman spectrum through irradiation with a laser of that surface of the aligned CNT aggregate which had been peeled off from the base material, using a microscopic laser raman system (Nicolet Almega XR; manufactured by Thermo Fisher Scientific K.K.).

Example 1

A specific example is given below to describe in detail an apparatus according to the present invention for producing an aligned CNT aggregate.

FIG. 1 shows a production apparatus of the present example. The production apparatus was constituted by an inlet purge section 101, a formation unit 102, means 103 to prevent gas mixing, a growth unit 104, a cooling unit 105, an outlet purge section 106, a transfer unit 107, and connecting sections 108 to 110. The respective furnaces and injections sections of the formation/growth units, the exhaust sections of the means to prevent gas mixing, the mesh belt, and the connecting sections were made of SUS 310 plated with aluminum.

The conditions for production of a catalyst substrate are described below. The substrate used was a 90 mm×90 mm Fe—NI—Cr alloy YEF 426 (Ni 42%, Cr 6%; manufactured by Hitachi Metals, Ltd.) with a thickness of 0.3 mm. The surface roughness was measured using a laser microscope, and it was found that the arithmetic average roughness was Ra≈2.1 µm. Alumina films with a thickness of 20 nm were formed on both front and back surfaces of the substrate with use of a sputtering apparatus. Then, an iron film (catalyst metal layer) with a thickness of 1.0 nm was formed only on the front surface with use of the sputtering apparatus.

The catalyst substrate thus prepared was placed on the mesh belt of the production apparatus, and subjected to the formation, growth, and cooling steps in this order with varying speeds of transfer of the mesh belt, whereby aligned CNT aggregates were produced.

The conditions for the inlet purge section, formation unit, means to prevent gas mixing, growth unit, cooling unit, outlet purge section of the production apparatus were set as follows:

Inlet purge section 101
Purge gas: nitrogen 60,000 sccm
Formation unit 102
Furnace temperature: 830° C.
Reducing gas: nitrogen 11,200 sccm, hydrogen 16,800 sccm
Processing time: 28 minutes
Means to prevent gas mixing 103
Exhaust quantity of the exhaust section 3a: 20 sLm
Exhaust quantity of the exhaust section 3b: 25 sLm
Exhaust quantity of the exhaust section 3c: 20 sLm
Growth unit 104
Furnace temperature: 830° C.
Raw material gas: nitrogen 16,040 sccm, ethylene 1,800 sccm, water-vapor-containing nitrogen 160 sccm (moisture content 16,000 ppmv)
Processing time: 11 minutes
Cooling unit 105
Cooling water temperature: 30° C.
Inert gas: nitrogen 10,000 sccm
Cooling time: 30 minutes
Outlet purge section 106
Purge gas: nitrogen 50,000 sccm Serial production was carried out under the foregoing conditions.

Although the properties of an aligned CNT aggregate that is produced according to the present example depends on the details of conditions for production, a typical aligned CNT aggregate had a density of 0.03 g/cm$^3$, a BET specific surface area of 1,100 m$^2$/g, an average external diameter of 2.9 nm, a half width of 2 nm, a carbon purity of 99.9%, and a Hellman's orientation coefficient of 0.7. The results of the serial production are shown in Table 1.

TABLE 1

| Number of times of production | 1 | 300 |
|---|---|---|
| Production volume (mg/cm$^2$) | 1.7 | 1.8 |
| G/D ratio | 8.1 | 7.2 |
| BET specific surface area (m$^2$/g) | 1,057 | 1,090 |

Even in the case of a comparison between the first production and the 300th production, neither a decrease in production volume nor deterioration in quality of aligned CNT aggregates can be observed.

Further, during the serial production, the reducing gas was sampled through a gas sampling port installed near the reducing gas injection section, and the constitution of the sample was analyzed by an FTIR analyzer (Nicolet 6700 FT-IR; manufactured by Thermo Fisher Scientific K.K.). As a result, it was confirmed that the concentration of ethylene in the formation furnace was kept at 50 ppm by the means to prevent gas mixing. This concentration is translated into a concentration of carbon atoms of approximately $3\times10^{21}$ atoms/m$^3$.

It was shown that an apparatus of the present invention can solve problems with a decrease in production volume and deterioration in quality of aligned CNT aggregates during serial production.

Example 2

A specific example is given below to describe in detail an apparatus according to the present invention for producing an aligned CNT aggregate.

FIG. 2 shows a production apparatus of the present example. The production apparatus was constituted by an inlet purge section 201, a formation unit 202, gate valves 203a to 203g, a growth unit 204, a cooling unit 205, an outlet purge section 206, a transfer unit 207, and a connecting section 208. The respective furnaces and injections sections of the formation/growth units, the robot arm, and the connecting section were made of SUS 310 plated with aluminum.

The conditions for production of a catalyst substrate are described below. The substrate used was a 90 mm×90 mm Fe—NI—Cr alloy YEF 426 (Ni 42%, Cr 6%; manufactured by Hitachi Metals, Ltd.) with a thickness of 0.3 mm. The surface roughness was measured using a laser microscope, and it was found that the arithmetic average roughness was Ra≈2.1 µm. Alumina films with a thickness of 20 nm were formed on both front and back surfaces of the substrate with use of a sputtering apparatus. Then, an iron film (catalyst metal layer) with a thickness of 1.0 nm was formed only on the front surface with use of the sputtering apparatus.

The catalyst substrate thus prepared was placed in the inlet purge section, and transferred by the robot arm to be subjected to the formation, growth, and cooling steps in this order, whereby aligned CNT aggregates were produced.

The conditions for the inlet purge section, formation unit, growth unit, cooling unit, outlet purge section of the production apparatus were set as follows:

Inlet purge section 201
Inert gas: nitrogen 12,000 sccm
Gas replacement time: 5 minutes Formation unit 202
Furnace temperature: 820° C.
Reducing gas: nitrogen 300 sccm, hydrogen 2,700 sccm
Processing time: 10 minutes
Growth unit 204
Furnace temperature: 820° C.
Raw material gas: nitrogen 2,674 sccm, ethylene 300 sccm, water-vapor-containing nitrogen 26 sccm (moisture content 16,000 ppmv)
Processing time: 10 minutes
Cooling unit 205
Cooling water temperature: 30° C.
Inert gas: nitrogen 3,000 sccm
Cooling time: 30 minutes
Outlet purge section 206
Inert gas: nitrogen 12,000 sccm
Gas replacement time: 5 minutes Serial production was carried out under the foregoing conditions. The results of the serial production are shown in Table 2.

TABLE 2

| Number of times of production | 1 | 300 |
|---|---|---|
| Production volume (mg/cm$^2$) | 1.8 | 1.8 |
| G/D ratio | 5.7 | 6.1 |
| BET specific surface area (m$^2$/g) | 1,103 | 1,058 |

Even in the case of a comparison between the first production and the 300th production, neither a decrease in production volume nor deterioration in quality of aligned CNT aggregates can be observed.

Further, during the serial production, the reducing gas was sampled through a gas sampling port installed near the reducing gas injection section, and the constitution of the sample was analyzed by an FTIR analyzer (Nicolet 6700 FT-IR; manufactured by Thermo Fisher Scientific K.K.). As a result, no ethylene was detected.

It was shown that an apparatus of the present invention can solve problems with a decrease in production volume and deterioration in quality of aligned CNT aggregates during serial production.

(Example of Verification 1)

With use of the apparatus (FIG. 1) of the present invention, production of CNTs was attempted under the same conditions as in Example 1, except that an inert gas free of hydrogen gas (at a supply rate of 28,000 sccm) was fed from the reducing gas injection section into a reducing furnace. As a result, it was only found that the catalyst substrate had a blackened surface and there were no aligned CNT aggregates grown on the base material.

Thus, the necessity of a formation step in production of aligned CNT aggregates was confirmed.

(Example of Verification 2)

Figure 3:
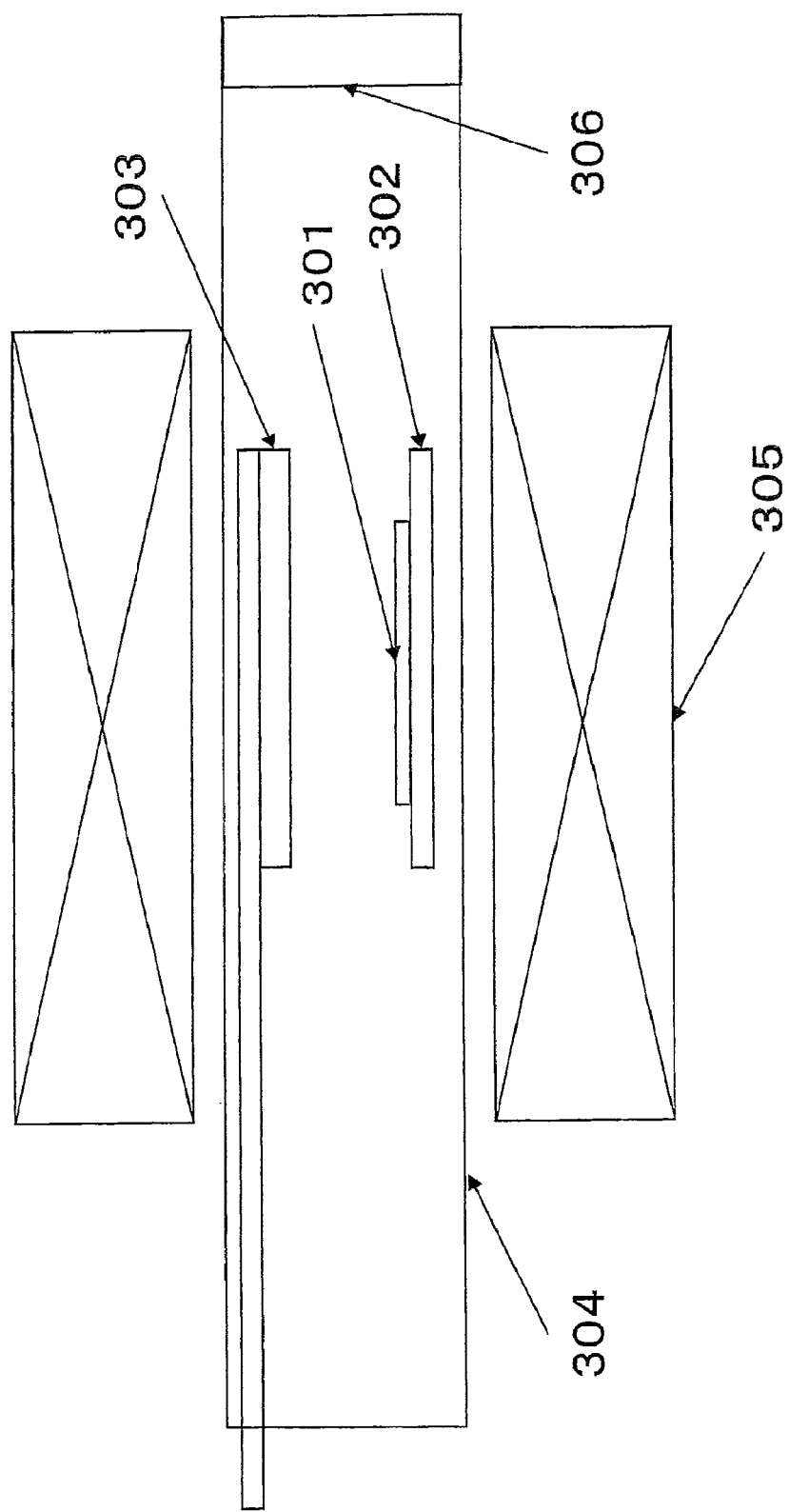
FIG. 3 is a block diagram schematically showing the configuration of a production apparatus used in Example of Verification 2 of the present invention.

Production of aligned CNT aggregates was carried out with use of an apparatus, shown in FIG. 3, which sequentially executes a reducing step and a growth step in a single furnace without moving a base material. This apparatus was constituted by: a reaction furnace 304 (with an internal diameter 50 mm and a heating length of 360 mm), composed of quartz, in which a catalyst substrate 301 is put; a heater 305 provided in such a manner as to surround the reaction furnace 304; a gas injection section 303 connected to one end of the reaction furnace 304 so as to supply a reducing gas and a raw material gas; an exhaust vent 306 connected to the other end of the reaction furnace 304; and a substrate holder 302, composed of quartz, on which the catalyst substrate 301 is fixed. Although not shown, a control device including a flow control valve and a pressure control valve was further provided in an appropriate place so as to control the flow rate of the reducing gas and the flow rate of the raw material gas.

The internal temperature of the reaction furnace 304 was raised to 800° C., and a reducing gas (at a total supply rate of 4,000 sccm) obtained by mixture of nitrogen (at a supply rate of 400 sccm) and hydrogen (at a supply rate of 3,600 sccm) was injected from the gas injection section 303 onto a catalyst substrate. A 40 mm×40 mm catalyst substrate 301 prepared in the same manner as in Example 1 was transferred into the reaction furnace 304, and a predetermined period of time (30 minutes) was allowed to elapse while the reducing gas was being fed into the reaction furnace 304 with the internal temperature kept at 800° C.

Then, the supply of the reducing gas from the gas injection section 303 was stopped, and ethylene (at a supply rate of 100 sccm) and a mixture of nitrogen (with a moisture content of 7,800 ppmv; at a supply rate of 18 sccm) containing water as a catalyst activation material and nitrogen (at a supply rate of 900 sccm) were fed from the gas injection section and both blown onto a surface of the catalyst substrate (base material) 301 for a predetermined period of time (10 minutes), whereby aligned CNT aggregates were produced. The results of serial production through repetition of the aforementioned operation are shown in Table 3.

TABLE 3

| Number of times of production | 1 | 19 |
|---|---|---|
| Production volume (mg/cm$^2$) | 1.7 | 0.8 |
| G/D ratio | 5.3 | 3.4 |
| BET specific surface area (m$^2$/g) | 989 | 733 |

A comparison between the first production and the nineteenth production clearly shows a decrease in production volume and deterioration in quality of aligned CNT aggregates.

(Example of Verification 3)

Figure 4:
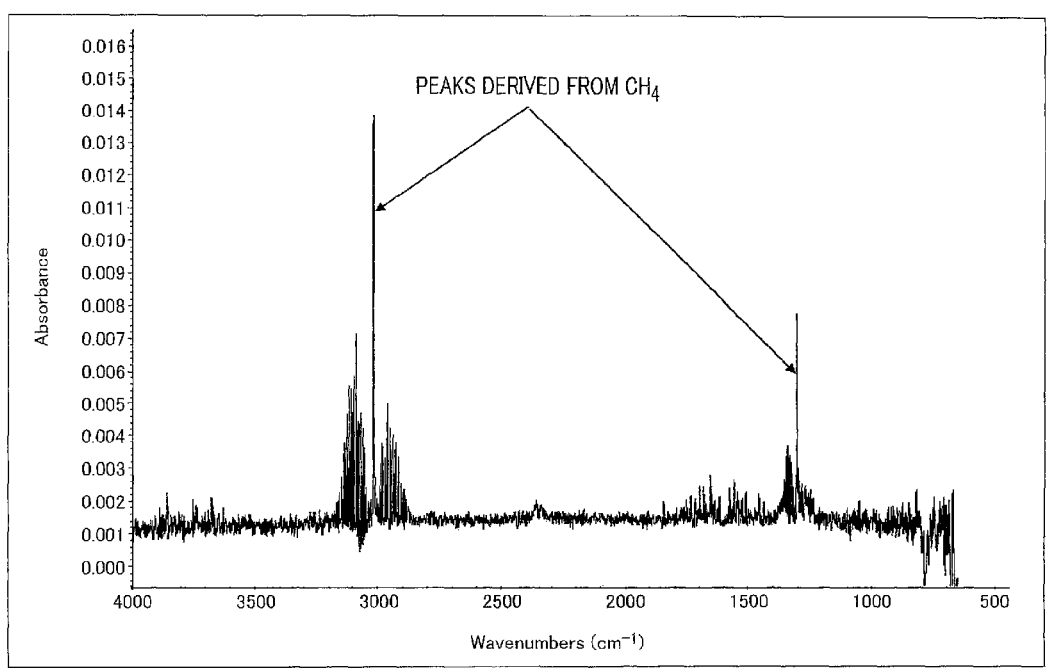
FIG. 4 is a graph showing an experimental result according to Example of Verification 3 of the present invention.

An experiment was carried out to confirm the conjecture on the mechanism by which carbon contaminants in a furnace causes a decrease in production volume and deterioration in quality of aligned CNT aggregates. Production of aligned CNT aggregates was carried out a plurality of times with the same apparatus and catalyst substrate and under the same conditions as shown in Example of Verification 2. Then, the reducing gas was sampled during the formation step, and the constitution of the sample was analyzed by an FTIR analyzer (Nicolet 6700 FT-IR; manufactured by Thermo Fisher Scientific K.K.). As a result, an absorption spectrum was obtained. The absorption spectrum is shown in FIG. 4. It was confirmed that the reducing gas had peaks derived from hydrocarbon gas (especially methane gas) and, in particular, it was revealed that a large amount of methane gas had been generated.

(Example of Verification 4)

Next, as an experiment to simulate an incident where the raw material gas flows into the formation furnace, aligned CNT aggregates were produced with varying concentrations of ethylene contained in the reducing gas.

The experiment was carried out under the same conditions with the same production apparatus and catalyst substrate as in Example of Verification 2, except that ethylene was intentionally mixed into the reducing gas.

Figure 5:
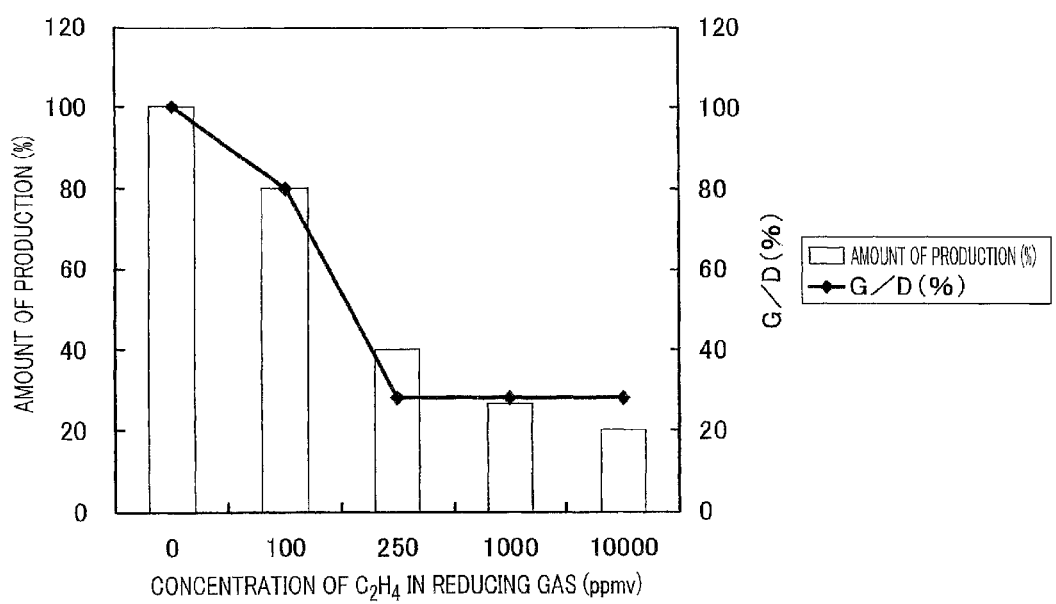
FIG. 5 is a graph showing an experimental result according to Example of Verification 4 of the present invention.

FIG. 5 is a graph, obtained as a result, which shows a relationship among the production volume of aligned CNT aggregates, the G/D ratio, and the concentration of ethylene in the reducing gas. The production volume of aligned CNT aggregates and the G/D ratio are indicated by relative values with an ethylene concentration of 0 ppm as 100%. As shown in FIG. 4, both the yield and the G/D ratio fell by approximately 40% at the concentration of 250 ppmv (which is translated into a concentration of carbon atoms of approximately $1 \times 10^{22}$ atoms/m$^3$) of ethylene in the reducing gas, and both the yield and the G/D ratio fell by approximately 75% at the concentration of 1,000 ppmv (which is translated into a concentration of carbon atoms of approximately $5 \times 10^{22}$ atoms/m$^3$). From these results, it was shown that it is necessary, in the production of aligned CNT aggregates, that the means to prevent gas mixing prevents mixture of the raw material gas mixing into the reducing gas so that the concentration of carbon atoms in the reducing gas is smaller than or equal to $5 \times 10^{22}$ atoms/m$^3$.

INDUSTRIAL APPLICABILITY

The present invention can produce aligned CNT aggregates with high production efficiency without entailing deterioration in quality during serial production, and as such, can be suitably used in the field of electronic device materials, optical element materials, conductive materials, and the like.

REFERENCE SIGNS LIST 101, 201: Inlet purge section
102, 202: Formation unit
102a, 202a: Formation furnace
102b, 202b: Reducing gas injection section
102c, 202c: Heater
103, 203: Means to prevent gas mixing
103a to 103c: Exhaust section
104, 204: Growth unit
104a, 204a: Growth furnace
104b, 204b: Raw material gas injection section
104c, 204c: Heater
105, 205: Cooling unit
105a, 205a: Cooling furnace
105b, 205b: Coolant gas injection section
105c, 205c: Water-cooled cooling tube
106, 206: Outlet purge section
107, 207: Transfer unit
107a: Mesh belt
107b: Belt driving section
108 to 110, 208: Connecting section
111, 209, 301: Catalyst substrate (base material)
203a to 203g: Gate valve
207a: Robot arm
302: Substrate holder
303: Gas injection section
304: Reaction furnace
305: Heater
306: Exhaust vent

The invention claimed is:

1. A method for producing an aligned carbon-nanotube aggregate by synthesizing the aligned carbon-nanotube aggregate on a base material having a catalyst on a surface thereof, the method comprising:
a formation step of causing an environment surrounding the catalyst to be an environment of a reducing gas and heating at least either the catalyst or the reducing gas, the formation step being executed in a formation unit which has a formation furnace;
a growth step of synthesizing the aligned carbon-nanotube aggregate by causing the environment surrounding the catalyst to be an environment of a raw material gas and by heating at least either the catalyst or the raw material gas, the growth step being executed in a growth unit which has a growth furnace,
means to prevent gas mixing being used to prevent gas from the formation furnace from mixing with gas from the growth furnace, the means to prevent gas mixing being provided in a connection section via which the growth furnace and formation furnace of the respective units are spatially connected.

2. The method as set forth in claim 1, wherein the means to prevent gas mixing is used to maintain a concentration of carbon atoms in the environment of the reducing gas at a value smaller than or equal to $5 \times 10^{22}$ atoms/m$^3$.

3. The method as set forth in claim 1, wherein the environment of the raw material gas is an environment of high-carbon concentration.

4. The method as set forth in claim 1, wherein the environment of the raw material gas contains a catalyst activation material.

5. A method for producing an aligned carbon-nanotube aggregate by synthesizing the aligned carbon-nanotube aggregate on a base material having a catalyst on a surface thereof, the method comprising:
a formation step of causing an environment surrounding the catalyst to be an environment of a reducing gas and heating at least either the catalyst or the reducing gas, the formation step being executed in a formation unit;
a growth step of synthesizing the aligned carbon-nanotube aggregate by causing the environment surrounding the catalyst to be an environment of a raw material gas containing a catalyst activation material and by heating at least either the catalyst or the raw material gas, the growth step being executed in a growth unit.

6. The method as set forth in claim 5, wherein the catalyst activation material is an oxygen-containing substance.

7. The method as set forth in claim 5, wherein the catalyst activation material is water, hydrogen sulfide, oxygen, ozone, an acidic gas, carbon monoxide, carbon dioxide, an alcohol, an ether, a ketone, an aldehyde, an ester, or nitrogen oxide.

8. The method as set forth in claim 1, wherein an input purge section is used to prevent outside air from flowing into a furnace of an apparatus through a base-material inlet.

9. The method as set forth in claim 1, wherein an output purge section is used to prevent outside air from flowing into a furnace of an apparatus through a base-material outlet.

10. The method as set forth in claim 5, wherein the growth unit includes a section for adding a catalyst activation material, and
wherein the growth step is executed in the environment of the raw material gas, wherein the environment is an environment of high-carbon concentration and contains the catalyst activation material.

11. A method for producing an aligned carbon-nanotube aggregate by synthesizing the aligned carbon-nanotube aggregate on a base material having a catalyst on a surface thereof, the method comprising:
a formation step of causing an environment surrounding the catalyst to be an environment of a reducing gas and heating at least either the catalyst or the reducing gas, the formation step being executed in a formation unit which has a formation furnace;
a growth step of synthesizing the aligned carbon-nanotube aggregate by causing the environment surrounding the catalyst to be an environment of a raw material gas and by heating at least either the catalyst or the raw material gas, the growth step being executed in a growth unit which has a growth furnace, a step of providing means for preventing gas from mixing in order to prevent gas from the formation furnace from mixing with gas from the growth furnace, wherein means for preventing gas from mixing is provided in a connecting section through which the formation unit and transfer unit have their respective furnaces spatially connected.

12. A method for producing an aligned carbon-nanotube aggregate by synthesizing the aligned carbon-nanotube aggregate on a base material having a catalyst on a surface thereof, the method comprising:

a formation step of causing an environment surrounding the catalyst to be an environment of a reducing gas and heating at least either the catalyst or the reducing gas, the formation step being executed in a formation unit which has a formation furnace;

a growth step of synthesizing the aligned carbon-nanotube aggregate by causing the environment surrounding the catalyst to be an environment of a raw material gas and by heating at least either the catalyst or the raw material gas, the growth step being executed in a growth unit which has a growth furnace, a step of preventing gas from mixing in order to prevent gas from the formation furnace from mixing with gas from the growth furnace, wherein the gas is prevented from mixing by providing a connecting section through which the formation unit and transfer unit have their respective furnaces spatially connected.

* * * * *